United States Patent
Sweere et al.

(10) Patent No.: US 10,324,642 B2
(45) Date of Patent: Jun. 18, 2019

(54) PERIPHERAL COMPONENT INTERCONNECT EXPRESS (PCIE) SOLID STATE DRIVE (SSD) ACCELERATOR

(71) Applicant: Sanmina Corporation, San Jose, CA (US)

(72) Inventors: Paul Sweere, Foothill Ranch, CA (US); Jay Patel, San Jose, CA (US); Irfan Syed, San Jose, CA (US)

(73) Assignee: SANMINA CORPORATION, San Jose, CA (US)

( * ) Notice: Subject to any disclaimer, the term of this patent is extended or adjusted under 35 U.S.C. 154(b) by 19 days.

(21) Appl. No.: 14/300,231

(22) Filed: Jun. 9, 2014

(65) Prior Publication Data

US 2014/0365714 A1    Dec. 11, 2014

Related U.S. Application Data

(60) Provisional application No. 61/832,286, filed on Jun. 7, 2013.

(51) Int. Cl.
| | |
|---|---|
| *G06F 3/06* | (2006.01) |
| *G06F 12/02* | (2006.01) |
| *G06F 13/40* | (2006.01) |
| *G06F 11/30* | (2006.01) |
| *G06F 1/20* | (2006.01) |

(Continued)

(52) U.S. Cl.
CPC ........... *G06F 3/0625* (2013.01); *G06F 1/206* (2013.01); *G06F 1/3206* (2013.01); *G06F 1/3268* (2013.01); *G06F 3/0659* (2013.01); *G06F 3/0679* (2013.01); *G06F 11/3041* (2013.01); *G06F 12/0246* (2013.01); *G06F 13/409* (2013.01); *G06F 11/3058* (2013.01); *G06F 2212/7211* (2013.01); *G11C 7/04* (2013.01);

(Continued)

(58) Field of Classification Search
None
See application file for complete search history.

(56) References Cited

U.S. PATENT DOCUMENTS

| | | | | |
|---|---|---|---|---|
| 2004/0215371 | A1* | 10/2004 | Samson | G05D 23/1919 |
| | | | | 700/299 |
| 2007/0211548 | A1* | 9/2007 | Jain | G11C 5/04 |
| | | | | 365/211 |

(Continued)

*Primary Examiner* — Sean D Rossiter
*Assistant Examiner* — Charles J Choi
(74) *Attorney, Agent, or Firm* — Loza & Loza, LLP; Julio M. Loza; Tyler J. Barrett (57) ABSTRACT

A peripheral component interconnect express (PCIe) solid state drive (SSD) accelerator, having a PCIe card and separate a flash daughter-card, is provided. By including flash memory devices on a separate daughter-card, the flash memory devices are thermally decoupled from the hotter devices on the main PCIe providing additional thermal operating margins for the entire design. Furthermore, as flash memory devices are the most likely part of the subsystem to wear out over time due, including flash memory devices on a separate daughter-card allows the flash memory devices to become a field replaceable unit that can be easily replaced. EEPROMs may be included on the flash daughter-card to record the current wear state of the NAND flash devices. Knowing the wear history of the flash memory device allows the seller to replace the flash daughter-card of a customer with a daughter-card having a similar wear state.

17 Claims, 8 Drawing Sheets

(51) Int. Cl.
*G06F 1/3206* (2019.01)
*G06F 1/3234* (2019.01)
*G11C 7/04* (2006.01)

(52) U.S. Cl.
CPC .......... *Y02D 10/151* (2018.01); *Y02D 10/154* (2018.01); *Y02D 10/16* (2018.01)

(56) References Cited

U.S. PATENT DOCUMENTS

| | | | | | |
|---|---|---|---|---|---|
| 2008/0133947 | A1* | 6/2008 | Shimada | ............... | G06F 1/3203 713/320 |
| 2010/0153755 | A1* | 6/2010 | Chiu | ......................... | G06F 1/28 713/300 |
| 2010/0332727 | A1* | 12/2010 | Kapil | ...................... | G06F 12/08 711/103 |
| 2011/0167201 | A1* | 7/2011 | Huang | .................... | G06F 1/185 711/103 |
| 2012/0271482 | A1* | 10/2012 | Tsukazawa | ............. | G06F 1/206 700/300 |
| 2013/0346793 | A1* | 12/2013 | Flynn | .................. | G06F 11/1008 714/6.3 |

* cited by examiner

PERIPHERAL COMPONENT INTERCONNECT EXPRESS (PCIE) SOLID STATE DRIVE (SSD) ACCELERATOR

CLAIM OF PRIORITY

The present Application for Patent claims priority to U.S. Provisional Application No. 61/832,286 entitled "Peripheral Component Interconnect Express (PCIe) Solid State Drive (SSD) Accelerator", filed Jun. 7, 2013, which is hereby expressly incorporated by reference.

FIELD

Various features relate to improvements to PCIe solid state drive accelerators, and more particularly, to partitioning PCIe solid state drive accelerators into a PCIe Card and Separate Flash Daughter-Card and optimizing performance thereof.

BACKGROUND

Solid-state drives (SSD) are a form of data storage that uses solid-state memory to store data. Examples of solid state memory include static random access memory (SRAM), dynamic random access memory (DRAM), and flash memory. SSDs are less susceptible to mechanical failures compared to conventional hard disk drives because SSDs do not include as many moving parts as conventional disk drives, which store data on a rotating disk.

Access (i.e., communication) to the SSD may occur through, for example, a Peripheral Component Interconnect Express (PCIe) interface. PCIe is a high-speed serial computer expansion bus standard designed to replace the older Peripheral Component Interconnect (PCI), Peripheral Component Interconnect eXtended (PCI-X), and Accelerated Graphics Port (AGP) bus standards. PCIe SSD (or PCIe SSD accelerator) is a way of adding the speed of a solid-state drive (SSD) to server and storage devices. Additionally, cards in PCIe slots can be changed without shutting down the computer, and they consume less power than previous PCI technology.

An SSD may comprise a plurality of flash memory cells (e.g., NAND or DRAM memory cells). While flash memory has the benefit of being less susceptible to mechanical failures compared to conventional hard disk drives, flash memory also has the limitation of having a finite number of erase-write cycles. Most commercially available flash products are guaranteed to withstand a specific number of cycles before the wear begins to deteriorate the integrity of the storage, for example 100,000 program-erase (P/E) cycles. SSD controllers on PCIe SSD products may track the wear history of the flash memory devices over time so they can notify the host system when a threshold wear limit has been reached. For example, the SSD controllers may notify the host system when a threshold percentage or number (e.g., 5%, 10%, 20%, 30%, etc.) of the finite erase-write cycles remain available on the flash memory devices. This allows the host system to manage when a card or component needs to be replaced and/or warn the user if the flash memory device is getting close to the end of its life.

However, in many PCIe SSD products, the only place to store the wear history of the flash memory devices is in the flash memory devices themselves. Thus, if a flash memory device fails and is replaced, the wear history of the remaining good flash memory devices on that solid state drive could be lost. As most commercially available flash memory products come with a warranty or guarantee to withstand around a specific number cycles, not knowing the wear history causes problems. In the absence of flash memory device wear history records, under estimating or over estimating the remaining life of the flash memory device may short change either the customer or the seller.

Maintaining adequate thermal margins is a key challenge with PCIe SSD products. The flash memory devices (e.g., NAND flash memory devices) located on PCIe SSD products are typically the weakest link from a thermal standpoint. Thus, locating the flash memory devices in such a way as to reduce their temperatures is beneficial in improving the overall thermal margins of the PCIe SSD product.

Yet another challenge associated with PCIe SSD products is maintaining adequate operating power margins. The PCIe standard requires that a PCIe card not draw more than a maximum power limit (e.g., draw more than 25 Watts) from the host socket.

In view of the above, what is needed is a PCIe SSD product that is partitioned into a PCIe card and a separate flash daughter-card.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, a peripheral component interconnect express (PCIe) solid state drive (SSD) accelerator, having a PCIe card and a flash daughter-card, is provided. The flash daughter-card may be connected to the PCIe card by a flash daughter-card connector. The PCIe card may include a microcontroller; one or more SSD controller chips in communication with the microcontroller; a first temperature sensor, readable by the microcontroller, for determining if the PCIe card is operating within pre-determined thermal operating margins; and a flash daughter-card connector connected to the one or more SSD controller chips. The flash daughter-card may include one or more groups of flash memory devices; and a second temperature sensor, readable by the microcontroller, for determining if the flash daughter-card is operating within the pre-determined thermal operating margins. Each group in the one or more groups of flash memory devices comprises eight (8) flash devices.

According to one aspect, the PCIe card may further include a power conversion and monitor circuit coupled to the microcontroller for providing short term energy during a host power failure. The power conversion and monitor circuit includes one or more current sensors for monitoring current flowing to the PCIe card.

According to one aspect the microcontroller may periodically poll the first temperature sensor and the second temperature sensor to determine if system temperature exceeds a pre-determined temperature threshold. The microcontroller operates the one or more SSD controllers at full throttle performance if the system temperature is below the pre-determined temperature threshold. Alternatively, the microcontroller operates the one or more SSD controllers at reduced throttle performance if the system temperature exceeds the pre-determined temperature threshold.

According to one aspect, if power consumption for the PCIe card (e.g., main card and daughter card) is approaching a predefined limit, performance of one or more SSD controller chips may be dynamically throttled by providing an artificially high temperature reading to the one or more SSD controllers. This causes the one or more SSD controller chips to invoke performance throttling (e.g., reduce read/write access to the flash memory devices) which results in reduced power consumption.

According to one aspect, the PCIe card may further include a PCIe to SATA bridge chip for routing data via computer bus interfaces to the one or more SSD controller chips.

According to one aspect, the flash daughter-card may further include an electrically erasable programmable read-only memory (EEPROM) connected to each SSD controller chip in the one or more controller chips. The one or more SSD controller chips track wear statistics of each NAND flash device in the one or more groups of NAND flash devices during runtime. The wear statistics are periodically stored in the EEPROM for each of the one or more SSD controller chips.

According to one feature, a peripheral component interconnect express (PCIe) solid state drive (SSD) accelerator, having a PCIe card and a flash daughter-card, is provided. The flash daughter-card may be connected to the PCIe card by a flash daughter-card connector. The PCIe card may include a microcontroller; one or more SSD controller chips in communication with the microcontroller; a first temperature sensor, readable by the microcontroller, for determining if the PCIe card is operating within pre-determined thermal operating margins; and a flash daughter-card connector connected to the one or more SSD controller chips. The flash daughter-card may include one or more groups of NAND flash devices; an EEPROM connected to each SSD controller chip in the one or more controller chips; and a second temperature sensor, readable by the microcontroller, for determining if the flash daughter-card is operating within the pre-determined thermal operating margins. Each group in the one or more groups of NAND flash devices comprises eight (8) flash devices.

According to one aspect, the one or more SSD controller chips track wear statistics of each NAND flash device in the one or more groups of NAND flash devices during runtime. The wear statistics are periodically stored in the EEPROM for each of the one or more SSD controller chips.

DETAILED DESCRIPTION

In the following detailed description, numerous specific details are set forth in order to provide a thorough understanding of the embodiments. However, it will be understood by one of ordinary skill in the art that the embodiments may be practiced without these specific details. For example, operations may be shown in block diagrams, or not be shown at all, in order not to obscure the embodiments in unnecessary detail. In other instances, well-known operations, structures and techniques may not be shown in detail in order not to obscure the embodiments.

Overview

According to one aspect, a PCIe SSD accelerator is provided. Unlike products on the market, the PCIe SSD accelerator of the disclosed subject matter may place flash memory, such as NAND flash, entirely on a separate daughter-card assembly. Many PCIe SSD products do not employ a daughter-card at all and those that do fail to include solely NAND flash devices on the daughter-card.

By including NAND flash devices on a separate daughter-card, the NAND flash devices may be thermally decoupled from the hotter devices on the main PCIe (e.g. SSD controllers and bridge devices). As NAND flash devices are typically the weakest link from a thermal standpoint, removing the NAND flash devices from the main PCIe card and onto a separate daughter-card may provide additional thermal operating margins for the entire design. Additionally, locating the NAND flash devices on the daughter-card places them more directly in the system airflow which in turn helps cool the devices. Consequently, placing the NAND flash devices on a separate daughter-card provides a valuable thermal benefit to the PCIe SSD accelerator.

Furthermore, as NAND flash devices are the most likely part of the subsystem to wear out over time due to the NAND flash endurance issue, including NAND flash devices on a separate daughter-card allows the NAND flash devices to become a field replaceable unit (FRU) that can be easily replaced. Including NAND flash devices on a separate daughter-card also improves testability and manufacturability of the product as the flash daughter-card can be tested separately before being assembled into the whole product. Additionally, including NAND flash devices on a separate daughter-card also provides for more available PCB surface to fit more ICs in the allowed PCIe mechanical envelope, as well as simplified manufacturing by allowing swapping of different types of NAND daughter-cards for easier product configurability. The flash daughter-card of the present disclosure enables lower cost field upgrades to increase capacity of a field deployed PCIe SSD accelerator, since only the flash daughter-card needs to be replaced, not the entire accelerator product.

Additionally, the PCIe SSD accelerator may include EEPROMs on the flash daughter-card which can be used to record the current wear state of the NAND flash devices. The SSD controller chips can track wear statistics of the flash devices during runtime and periodically record these statistics in the EEPROMs. Knowing the wear history of the NAND flash device allows the seller to replace the flash daughter-card of a customer with a daughter-card having a similar wear state. As such, the seller would not be replacing nearly worn out flash devices with brand new devices resulting in a significant financial impact to the seller as well as providing an unintended financial benefit to the customer.

Partitioning PCIe SSD Accelerator into a PCIe Card and Separate Flash Daughter-Card

According to one approach, a PCIe SSD device is partitioned into multiple parts. For example, the PCIe SSD device may comprise a host/main card and a daughter-card. The daughter-car may include the NAND flash devices in which the wear history of the NAND flash devices may be stored. This allows the thermal or power operating margins to increase as the NAND flash devices would no longer be located on the main card and the wear history would not be lost if a NAND flash device on the PCIe SSD product failed. However, most PCIe SSD products do not employ a daughter-card and those that do fail to include NAND flash devices on the daughter-card.

Figure 1:
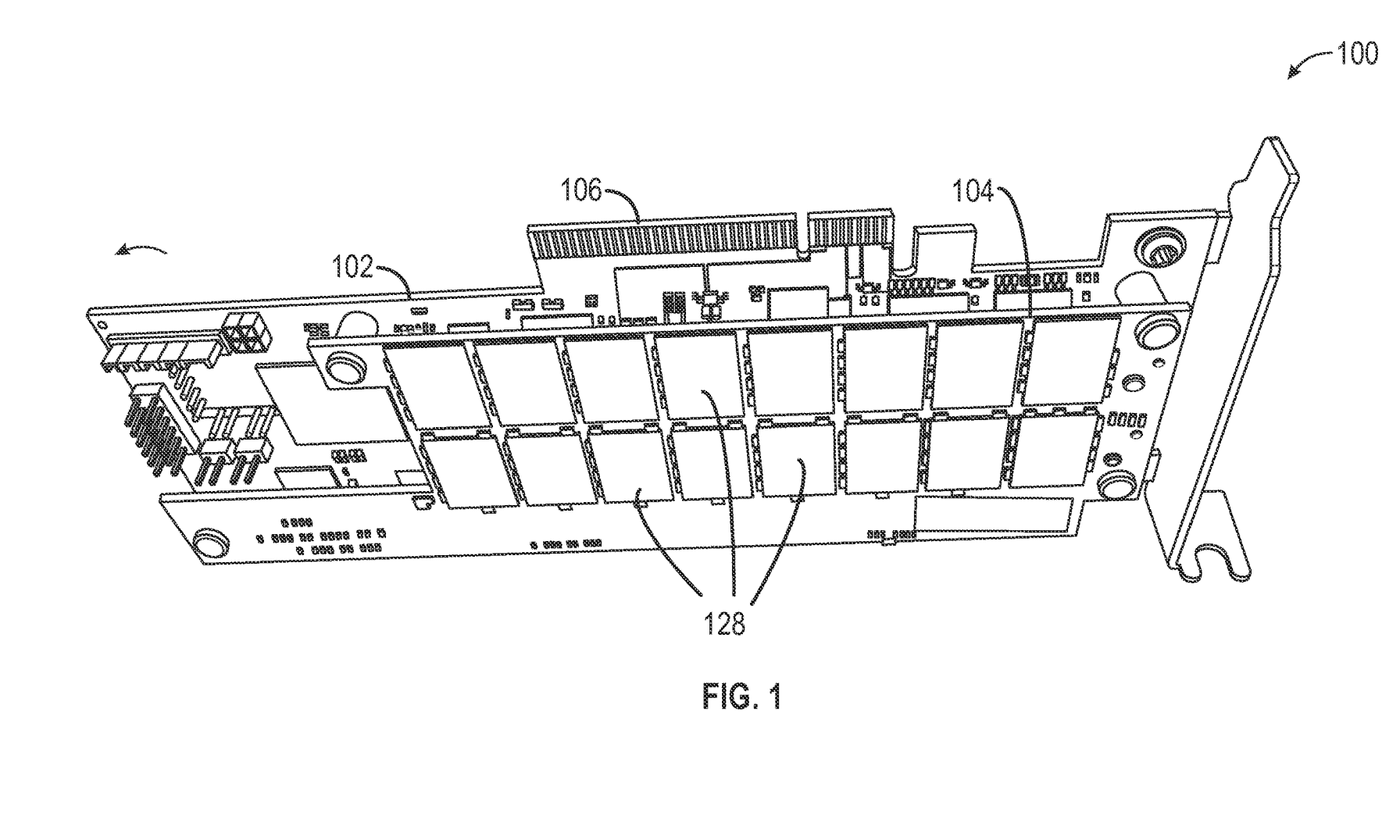
FIG. 1 illustrates a side perspective view of a subassembly partitioned into a PCIe card and separate flash daughter-card, according to one example.

FIG. 1 illustrates a side perspective view of a subassembly 100 partitioned into a PCIe main card 102 and a separate flash daughter-card 104. The subassembly 100 may be a peripheral component interconnect express (PCIe) solid state drive (SSD) accelerator, according to one example. The subassembly 100 may comprise a main PCIe printed circuit board assembly (PCBA) 102 (see FIG. 2A) and a NAND Flash Daughter PCBA 104 (see FIG. 2B).

Figure 2A:
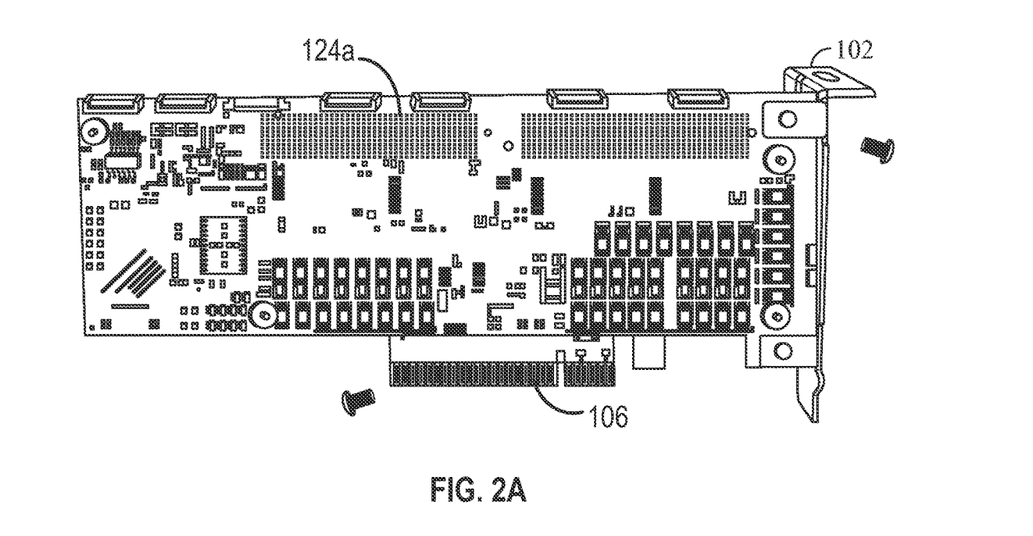
FIG. 2A illustrates a flash daughter-card of the subassembly of FIG. 1.

FIG. 2A illustrates an example of the main PCIe printed circuit board assembly 102, which may also be referred to as a main card. The main PCIe printed circuit board assembly 102 may include an edge connector or interface 106 that may serve to couple the main assembly 102 to a host bus. In one example, the edge connector or interface 106 may pull power from the host bus but does not send/receive signals of the host bus. Additionally, the main assembly 102 may also include a connector or interface 124a through which signals are transferred to/from the NAND Flash Daughter PCBA 104.

Figure 2B:
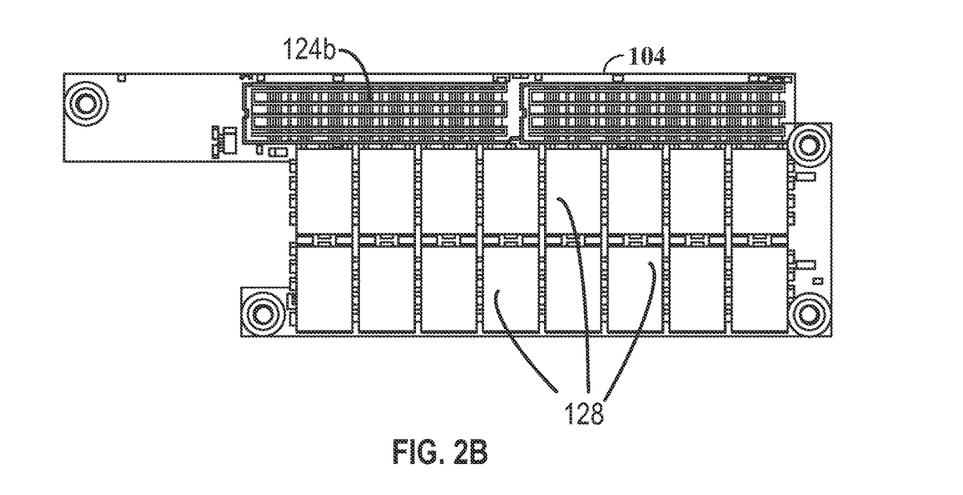
FIG. 2B illustrates a main PCIe card of the subassembly of FIG. 1.

FIG. 2B illustrates an example of the NAND Flash Daughter PCBA 104, which may also be referred to a daughter card. The NAND Flash Daughter PCBA 104 may include a plurality of NAND flash devices 128 (e.g., flash storage devices, flash memory storage devices, non-volatile storage devices, etc.). Additionally, the NAND Flash Daughter PCBA 104 may also include a connector or interface 124b through which signals are transferred to/from the PCIe printed circuit board assembly 102 Importantly, the plurality of NAND flash devices may be located solely on the NAND Flash Daughter PCBA 104. This allows the main PCIe printed circuit board assembly 102 to have increased thermal or power operating margins since the more temperature/power susceptible NAND flash devices are located elsewhere.

In one implementation the plurality of NAND flash devices 128 may be located on two surfaces of the NAND Flash Daughter PCBA 104. In such implementations, higher heat-generating components on the main PCIe printed circuit board assembly 102 may be located on a surface away from the NAND Flash Daughter PCBA 104 so as to reduce the heat to which the plurality of NAND flash devices 128 are exposed.

Yet in other implementations, the plurality of NAND flash devices 128 may only be located on an external surface away from the main PCIe printed circuit board assembly 102 so as to reduce their exposure heat generated by the components on the main PCIe printed circuit board assembly 102.

Figure 3:
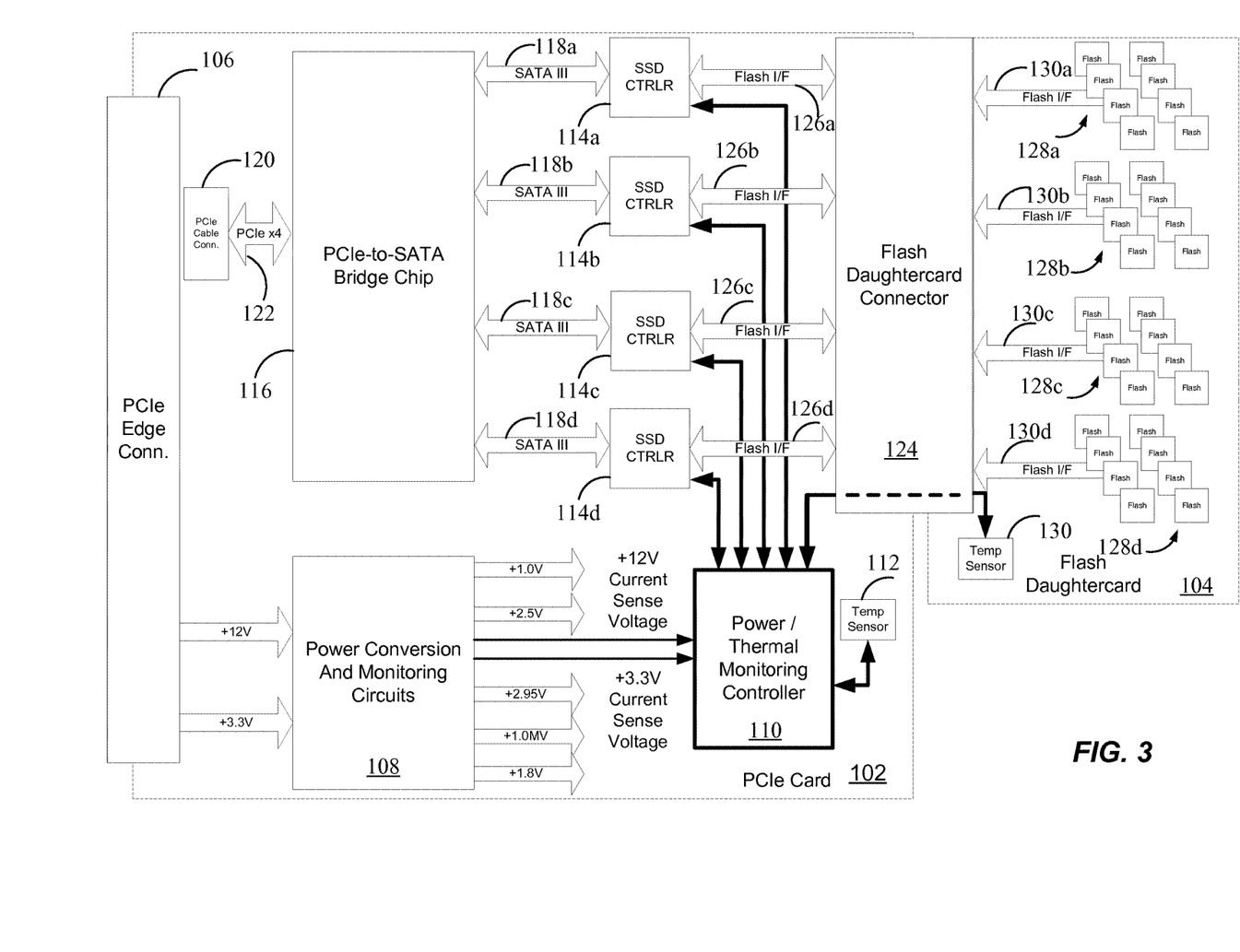
FIG. 3 illustrates a functional block diagram of the subassembly of FIG. 1.

FIG. 3 illustrates a functional block diagram of the subassembly 100 of FIG. 1. As shown, the PCIe card 102 may include a peripheral component interconnect express (PCIe) edge connector 106 provided at an edge of the main PCIe printed circuit board assembly 102 (i.e. PCIe card). According to one example, 12 volt and 3.3 volt inputs may be supplied to power conversion and monitoring circuits 108 via the PCIe edge connector 106. As described in further detail below, the power conversion and monitoring circuitry 108 may include holdup capacitance used for short term energy required in the event of a host power failure. In one implementation, while the PCIe edge connector 106 may draw power from a host bus to which it is coupled, it may not send/receive any signals over the host bus.

A power/thermal management microcontroller 110 may be utilized to monitor temperatures, using a temperature sensor 112 readable by the power/thermal management microcontroller 110, and power consumption of the SSD accelerator. The temperature sensor 112, readable by the microcontroller 110, may be used for determining if the PCIe card is operating within pre-determined thermal operating margins. The microcontroller 110 may periodically poll the temperature sensor 112 to determine system temperature and throttle performance if it exceeds a pre-determined temperature threshold. If the pre-determined temperature threshold is exceeded, the power/thermal management microcontroller 110 may communicate with one or more SSD controller chips 114a-114d to reduce their performance levels. The SSD controller chips 114a-114d may throttle access to the flash memory devices. That is, the SSD controller chips 114a-114d may extend the time between operations to/from the flash memory devices 128 to reduce the temperature. This may be done, for example, by inserting idle operations at the SSD controllers chips 114a-114d, thereby reducing read/write access operations to the flash memory devices 128.

A PCIe to SATA bridge chip 116 may be located on the PCIe main board 102 and configured to route data, via computer bus interfaces such as a SATA III 118a-118d, to the plurality of SSD NAND flash controller chips 114a-114d. A PCIe cable connector 120 may be connected to the PCIe to SATA bridge chip 116 by one or more PCIe high-speed serial computer expansion buses 122. A flash daughter-card connector 124 may be connected to the plurality of SSD NAND flash controller chips 114a-114d by a plurality of flash interface buses 126a-126d. The flash daughter-card 104 may be connected to the flash daughter-card connector 124. The daughter-card 104 may include a plurality of flash memory devices 128a-128d connected by a plurality of flash interfaces buses 130a-130b. A temperature sensor 130 may be located on the flash daughter-card 104 and connected to the power/thermal management microcontroller 110 via the flash daughter-card connector 124. The temperature sensor 130, readable by the microcontroller 110, is used for determining if the flash daughter-card is operating within pre-determined thermal operating margins. The microcontroller 110 may periodically poll the temperature sensor 130 to determine system temperature and throttle performance if the temperature has exceeded a pre-determined temperature threshold. If the pre-determined temperature threshold is exceeded, the power/thermal management microcontroller 110 may communicate with a plurality of SSD NAND flash controller chips 114a-114d to reduce read/write access operations to the flash memory devices 128.

Figure 8:
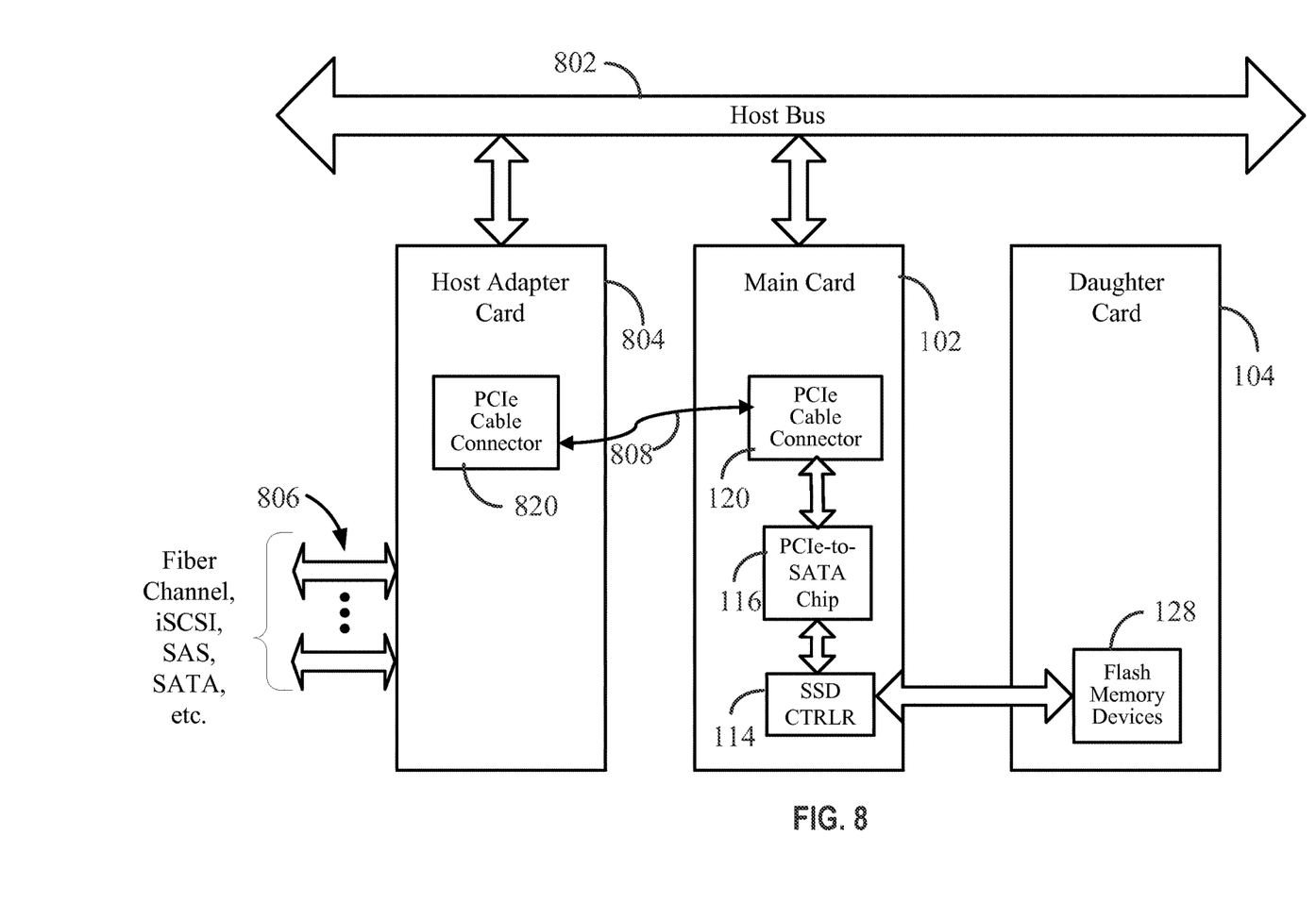
FIG. 8 is a block diagram illustrating a system in which the PCIe main card and flash daughter-card of FIGS. 1, 2A, and 2B may be implemented.

FIG. 8 is a block diagram illustrating a system in which the PCIe main card and flash daughter-card of FIGS. 1, 2A, and 2B may be implemented. A host bus 802 may be coupled to the main card 102 and the host adapter card 804. The daughter card 104 may be coupled to the main card. The host adapter card 804 may serve to convert communications between the host bus 802 (e.g., PCIe Bus) and one or more other types of buses 806 (e.g., fiber channel, iSCSI, SAS, SATA, etc.). For instance, the host adapter card 804 may not just obtain power from the host bus 802, but also data, commands, and/or signaling. The host adapter card 804 may then convert the data, commands, and/or signaling from a host bus format to one or more other formats compatible with the one or more other types of buses 806.

The host adapter card 804 may be coupled to the main card 102 via a cable 808 between PCIe cable connectors 820 and 120. It is through this cable 808 that the host adapter card 804 may send data from the host bus 802 to be temporarily stored by the flash memory devices 128 at the daughter card 104. In this manner, the main card 102 and daughter card 104 may buffer data storage or access and accelerate operations to/from the storage devices coupled to the other types of buses 806.

Power Conversion and Monitoring Circuits

Figure 4:
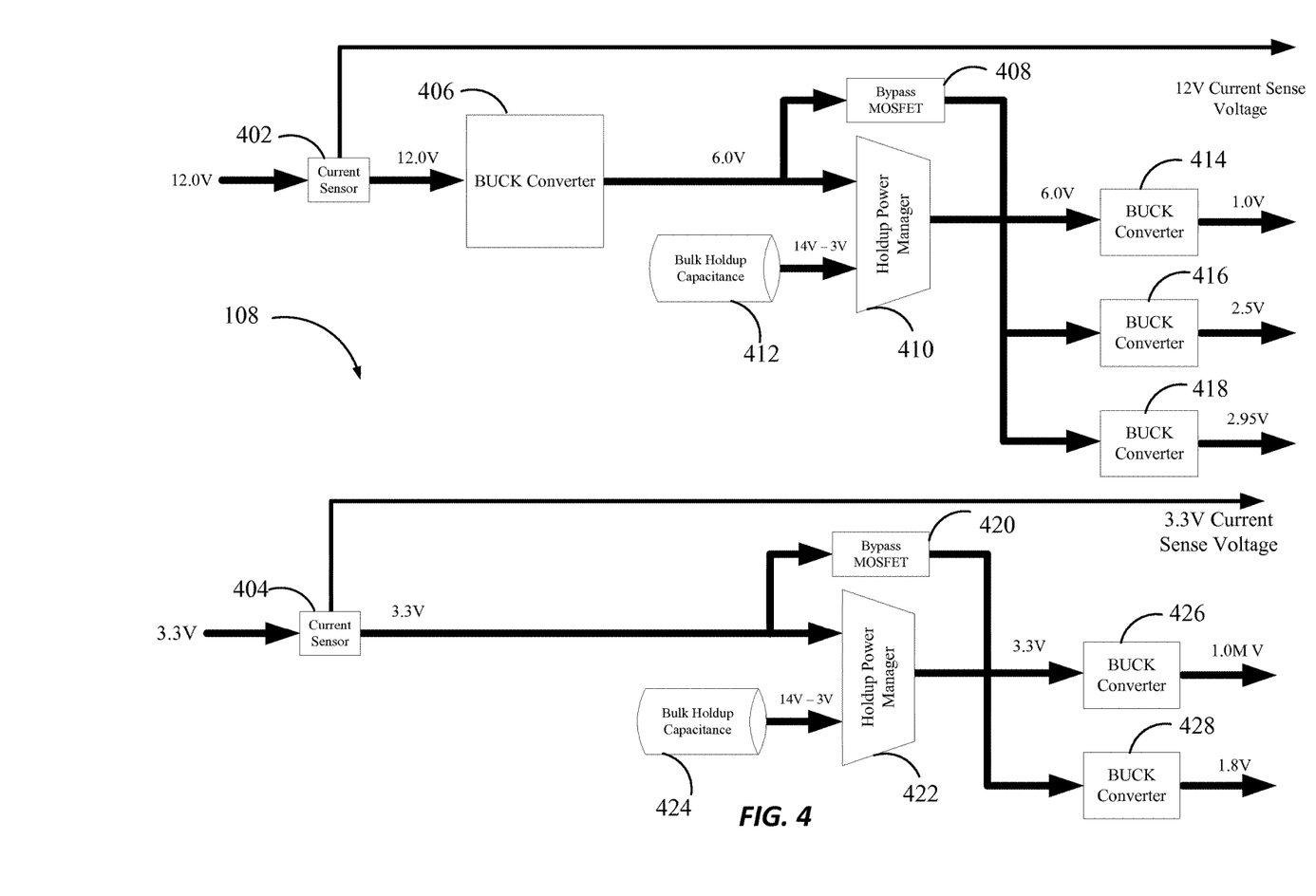
FIG. 4 illustrates a block diagram of the internal structure of the power conversion and monitoring circuits of FIG. 3.

FIG. 4 illustrates a block diagram of the internal structure of the power conversion and monitoring circuits 108 of FIG. 3. The power conversion and monitoring circuits 108 on the PCIe SSD accelerator 100 may constantly monitor the current flowing into the PCIe card from the host system on the 3.3V and 12V power inputs (or rails). The current to the PCIe card (main card 102 and daughter card 104) may be monitored using current sensors. As shown, a first current sensor 402 may be utilized to monitor or measure the current flowing on the 12V power input (or rail) while a second current sensor 404 may be utilized to monitor or measure the current flowing on the 3.3V power input (or rail).

In the power conversion and monitoring circuits 108, the output of the first current sensor 402 may be supplied to a first BUCK converter 406 which converts the 12V input to 6V. The 6V may then be supplied to a first bypass metal-oxide-semiconductor field-effect transistor (MOSFET) 408, for providing a current path bypassing a first holdup power manager 410, and the first holdup power manager 410. The first holdup power manager 410 may be used to manage a first bulk holdup capacitance 412. The first bulk holdup capacitance 412 may be used for supplying short term energy that is required to maintain operation of the circuitry in the event of a host power failure. Upon a power failure, the first bulk holdup power manager 410 may supply the energy or power stored in the first bulk holdup capacitance 412 to the power/thermal management microcontroller 110, the SSD controllers 114, the flash memory devices 128, etc., allowing completion of data write operations to the flash memory devices 128 (e.g., to avoid data loss).

In the power conversion and monitoring circuits 108, the output of the first bypass MOSFET and the output of the first holdup power manager 410 are supplied to a plurality of BUCK converters. The BUCK converts are used to step down the voltage. According to one example, the outputs may be supplied to three (3) different BUCK converters. As shown, a second BUCK converter 414 may convert the 6V to 1.0V, a third BUCK converter 416 may convert the 6V to 2.5V and a fourth BUCK converter 418 may convert the 6V to 2.95V.

In the power conversion and monitoring circuits 108, the output of the second current sensor 404 may be supplied to a second bypass MOSFET 420, for providing a current path bypassing a second holdup power manager 422, and the second holdup power manager 422. The second holdup power manager 422 may be used to manage a second bulk holdup capacitance 424 used for short term energy that is required to maintain operation of the circuitry in the event of a host power failure. Upon a power failure, the second bulk holdup power manager 422 may supply the energy or power stored in the second bulk holdup capacitance 424 to the power/thermal management microcontroller 110.

The output of the second bypass MOSFET 420 and the output of the second holdup power manager 422 are supplied to a plurality of BUCK converters. The BUCK converts are used to step down the voltage. According to one example, the outputs may be supplied to two (2) different BUCK converters. As shown, a fifth BUCK converter 426 may convert the 3.3V to 1.0 MV and a sixth BUCK converter 428 may convert the 3.3V to 1.8V.

Method for Managing PCBA Host Power Consumption

As mentioned previously, the PCIe standard requires that a PCIe card consume less than or equal to 25 watts from the host socket. This power requirement can be shared across the 12V and 3.3V voltage rails, or inputs, to the card. The ratio of allowed power levels, as well as maximum current specifications, on each input is defined by the PCIe standard.

According to one example, four (4) SSD controller chips may be included on one PCIe card in order to achieve target performance and storage capacity levels. Each SSD controller can work in parallel to service various IO requests from the host system (e.g., host adapter card 804).

The power consumption of an SSD subsystem may be heavily dependent on the activity level of the main card and daughter card subsystem—when the subsystem is servicing many IO requests (e.g., read/write operations from/to flash memory devices 128) very quickly (e.g., high performance) the power consumption and component temperatures rise. When the subsystem is idle, the power consumption and temperatures are reduced.

According to one feature, power consumption and/or temperature may be dynamically reduced by temporarily reducing performance of the subsystem, or "throttling". Throttling can be accomplished in several ways, but typically it is achieved by delaying or "spacing out in time" IO requests (e.g., read/write operations) from the host system (e.g., operations at the SSD controller chips 114) to the flash memory devices 128. For instance, while the SSD controller 114 may have request for several read or write operations queued, it may insert/inject one or more idle operations (e.g., which do not cause access to the flash memory devices 128) between one each of the read or write operations. Alternatively, another method employed by the SSD controller chip 114 may be to space out accesses to the flash memory devices 128.

According to one approach, the current sensors 402 and 404 may serve to ascertain the amount of current flowing into (or consumed by) the main card 102 and daughter card 104. Based on the currents detected by these current sensors 402 and 404, a power consumption for the main card 102 and daughter card 104 may be ascertained or estimated. If the power/thermal monitoring controller 110 detects that the total power consumption (i.e., consumption for the main card 102 and daughter card 104) is approaching a power threshold or limit (e.g., 25 Watts for PCIe cards), it may perform throttling to reduce power consumption.

Where the SSD controllers 114 may not be capable of performing power throttling directly, thermal throttling may be used to operate the main card 102 and daughter card 104 at maximum performance without exceeding a power limit. For instance, where power throttling is not directly available from the SSD controllers 114, the power/thermal monitoring controller 110 may report a higher temperature than actually sensed if the sensed power consumption approaches or reaches a power limit. Because the SSD controllers 114 may be adapted to throttle performance if the temperature increases, these SSD controllers 114 are tricked into, for example, inserting one or more idle operations between read/write operations at the SSD controllers 114, thereby reducing access to the flash memory devices 128. This reduction in read/write operations to the flash memory devices 128 also causes reduction in power consumption.

In one example, as the sensed power consumption for the main card 102 and daughter card 104 approach a power limit, the power/thermal monitoring controller 110 may gradually report a higher and higher temperature to cause the SSD controller 114 to throttle operations (e.g., extend the time between read/write operations, slowdown read/write operations, etc.).

Figure 5:
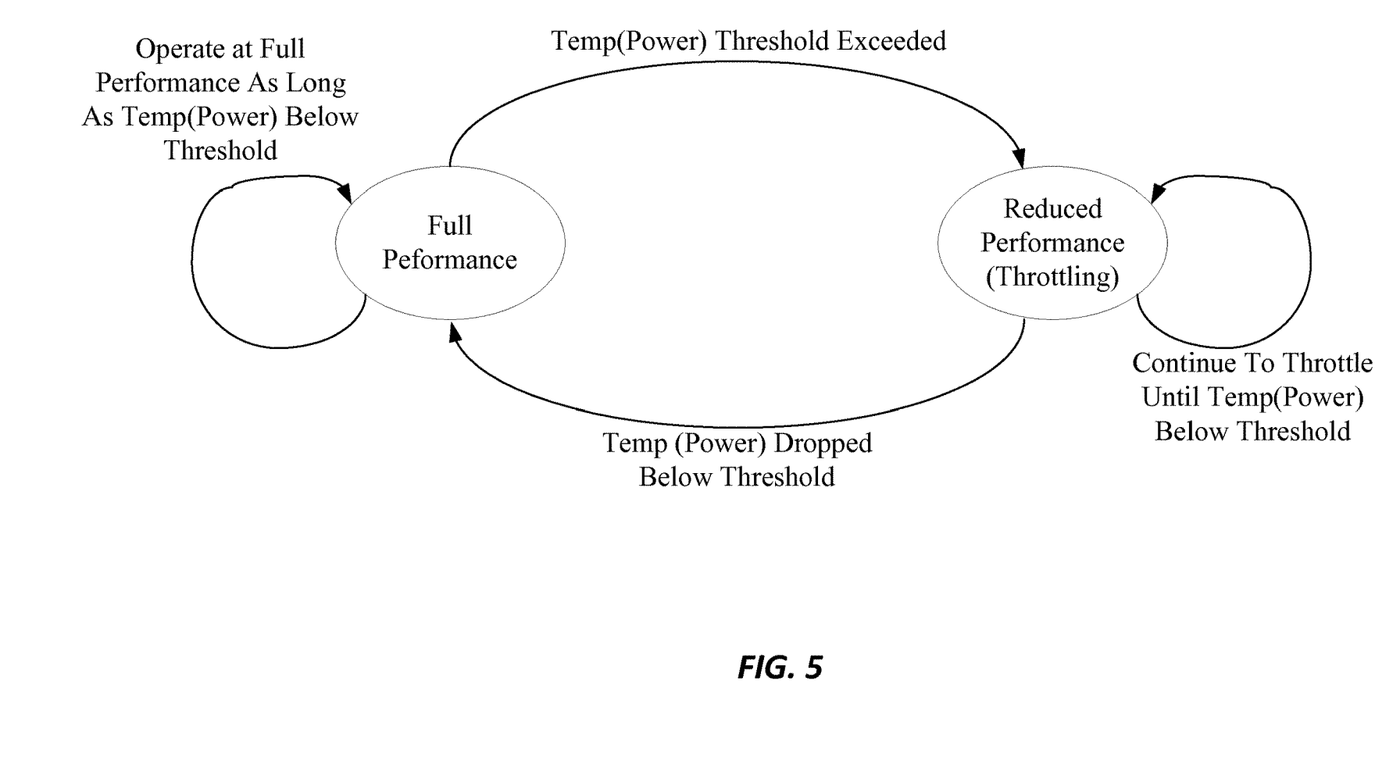
FIG. 5 is a diagram illustrating the concept of performance throttling.

FIG. 5 is a diagram illustrating the concept of performance throttling. As shown, the system may be operating at full performance until the temperature (power) exceeds a threshold value. When this threshold has been exceeded, throttling occurs (i.e. performance is reduced). The system continues to throttle until the temperature (power) falls below the threshold value. When the temperature (power) falls below the threshold value, the system will again operate at full performance.

According to one aspect, power throttling capability may be implemented by exploiting the existing temperature throttling capability of the SSD controllers and emulating a thermal sensor with a microcontroller.

According to one aspect, the SSD controller chips with temperature sensor input and temperature throttling functionality may be implemented in the SSD controller firmware using a power/thermal management microcontroller. During operation, the SSD controller chip may periodically poll a temperature sensor connected to its temperature sensor inputs. A standard temperature sensor IC may be used for this purpose. By periodically reading the sensor, the SSD controller can determine the system temperature and throttle performance if pre-determined temperature thresholds are exceeded.

As shown in FIG. 3, the power/thermal management microcontroller may be directly connected to the temperature sensor inputs of the SSD controller. The power/thermal management microcontroller may be programmed to emulate a standard temperature sensor device. Consequently, when the SSD controller reads the temperature sensor input pins, the power/thermal management microcontroller returns a temperature reading just as a standard temperature sensor IC would. Under most conditions, the power/thermal management microcontroller will return a temperature reading that is consistent with its own temperature sensors located on the PCIe card and daughter-card, so in effect the SSD controller is reading the "true" temperature.

In addition to monitoring its own temperature sensors, the power/thermal management microcontroller may also constantly monitor the current flowing into the PCIe card from the host system on the 3.3V and 12V power inputs. This may be accomplished via the current sensor devices, as shown in FIG. 4. Since the power/thermal management microcontroller knows the voltage levels on each of the power inputs, it may be able to calculate the total power consumption of the accelerator on a dynamic basis (Power=Current×Voltage).

When the total power consumed by the accelerator approaches (but does not exceed) 25 W, the power/thermal management microcontroller may begin to throttle performance of the SSD controllers by returning an artificially high temperature reading to the SSD controllers the next time they poll their temperature sensor ports. This causes the SSD controllers to invoke performance throttling, which in turn reduces the power consumption of the accelerator and ensures the power stays below 25 W. In effect, the power/thermal management microcontroller may implement a power throttling feedback system that uses the thermal throttling feature built into the SSD controllers.

As mentioned above, the power/thermal management microcontroller may also monitor its own thermal sensors located on both the flash daughter-card and PCIe card. When there is no need for power throttling (i.e. accelerator power below 25 W), the power/thermal management microcontroller may return the true temperature to the SSD controllers (the greater of the two temperature sensor readings). Thus, standard temperature throttling is supported as well.

Figure 6:
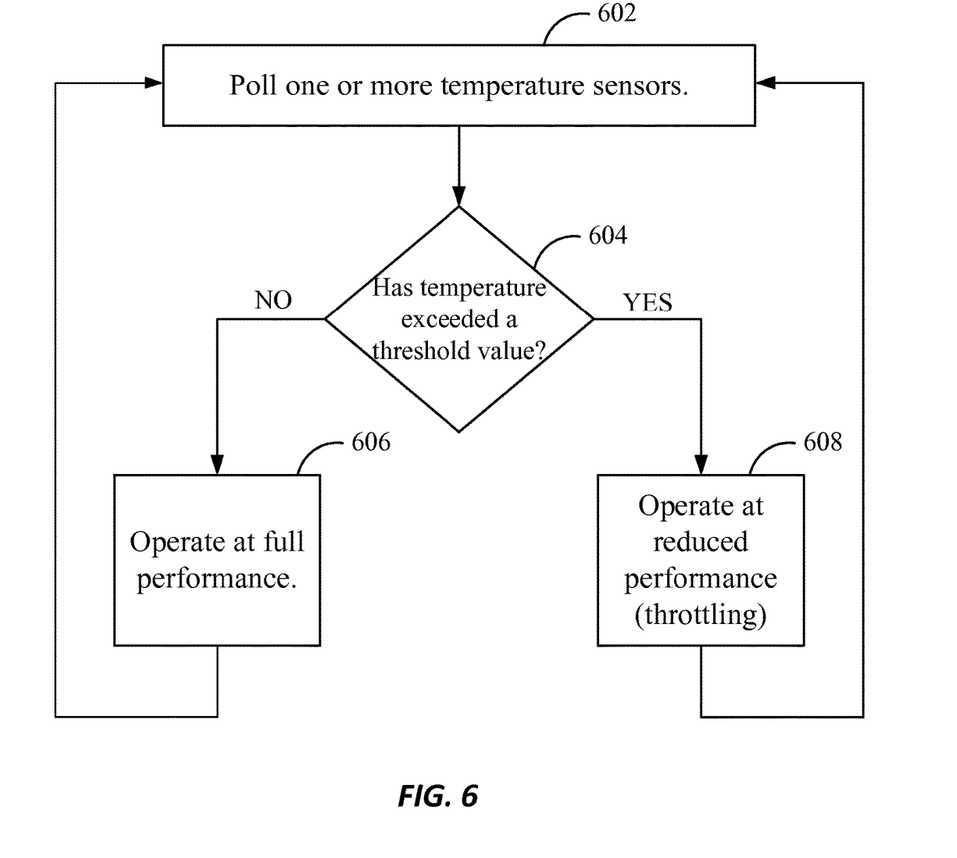
FIG. 6 illustrates a flow diagram of a method for managing printed circuit board assembly host power consumption, according to one example.

FIG. 6 illustrates a flow diagram of a method for managing printed circuit board assembly host power consumption, according to one example. First, the power/thermal management microcontroller 110 may periodically poll one or more temperature sensors 602. For example, the power/thermal management microcontroller 110 may periodically poll the first and second temperature sensors 112, 130 on the subassembly of FIG. 3. Next, the power/thermal management microcontroller 110 may determine if the temperature has exceeded a threshold value 604. If the threshold value has not been exceeded, the power/thermal management microcontroller 110 may operate the SSD controllers at full throttle performance 606. Alternatively, if the threshold value has been exceeded, the power/thermal management microcontroller 110 may begin to operate the SSD controllers at reduced throttling performance 608.

"Private" PCIe Connection to Companion PCIe Card

The subassembly described herein may be designed to connect specifically to a storage controller PCIe card as a sort of "private" cache that is not directly accessible from the host system processor. The storage controller may support standard storage interfaces, such as SATA, SAS, Fiber Channel, iSCSI, or ethernet, for example. The main card 102 and daughter card 104 subassembly may utilize a connector (e.g., custom PCIe connector) and cable assembly to connect the two cards together, which can be installed in a host system in a PCIe slots coupled to the same host bus. According to one aspect, the subassembly does not connect directly to the PCIe signals in host system PCIe connector—it only pulls power from the connector (See FIG. 3). The PCIe signals down to the host system via the PCIe edge connector may not be connected.

Flash Daughter-card EEPROM

Flash memory devices wear out during continuous use. The key wear mechanism on flash memory devices is program/erase cycles. The SSD controller executes program/erase cycles on the NAND flash devices as a result of the host writing data to the SSD. For example, the typical MLC NAND flash memory device in 2013 can tolerate up to 3,000 program/erase cycles per block before being completely worn out.

Modern SSD controllers track the wear state of the NAND flash components on the SSD over time, so that this information can be communicated to the host system. This host-SSD communication is normally done via an industry standard control/status interface such as SMART (SMART is part of the SATA standard). To maintain the state of the NAND flash wear, the SSD controller tracks the number of program/erase cycles that have been executed. The SSD controller records this information directly in the NAND flash devices themselves, since that is normally the only non-volatile storage the SSD controller has access to. In most cases, this is not a problem; however, in the case of a NAND flash device field failure, the wear history of the remaining good NAND flash devices on that SSD could be lost. Once the failed NAND flash device is replaced, there is no way to know the wear state of the other NAND flash devices on the SSD unless this information was recorded somewhere other than in the NAND flash devices themselves.

According to one aspect, when there are large numbers of PCIe SSD Accelerators in use, there may be some flash daughter-card field failures. If a warranty for the PCIe SSD Accelerator product is provided and if the wear state of a daughter-card cannot be determined, then a failed daughter-card must be replaced with a new daughter-card to ensure that the customer receives the product back with a known wear condition for the flash devices. However, this could result in a significant financial impact to the seller as the seller could unknowingly be replacing nearly worn out flash devices with brand new devices, thus providing an unintended financial benefit to the customer. Accordingly, knowing the wear history of the NAND flash device allows the seller to replace the flash daughter-card of a customer with a daughter-card having a similar wear state.

Figure 7:
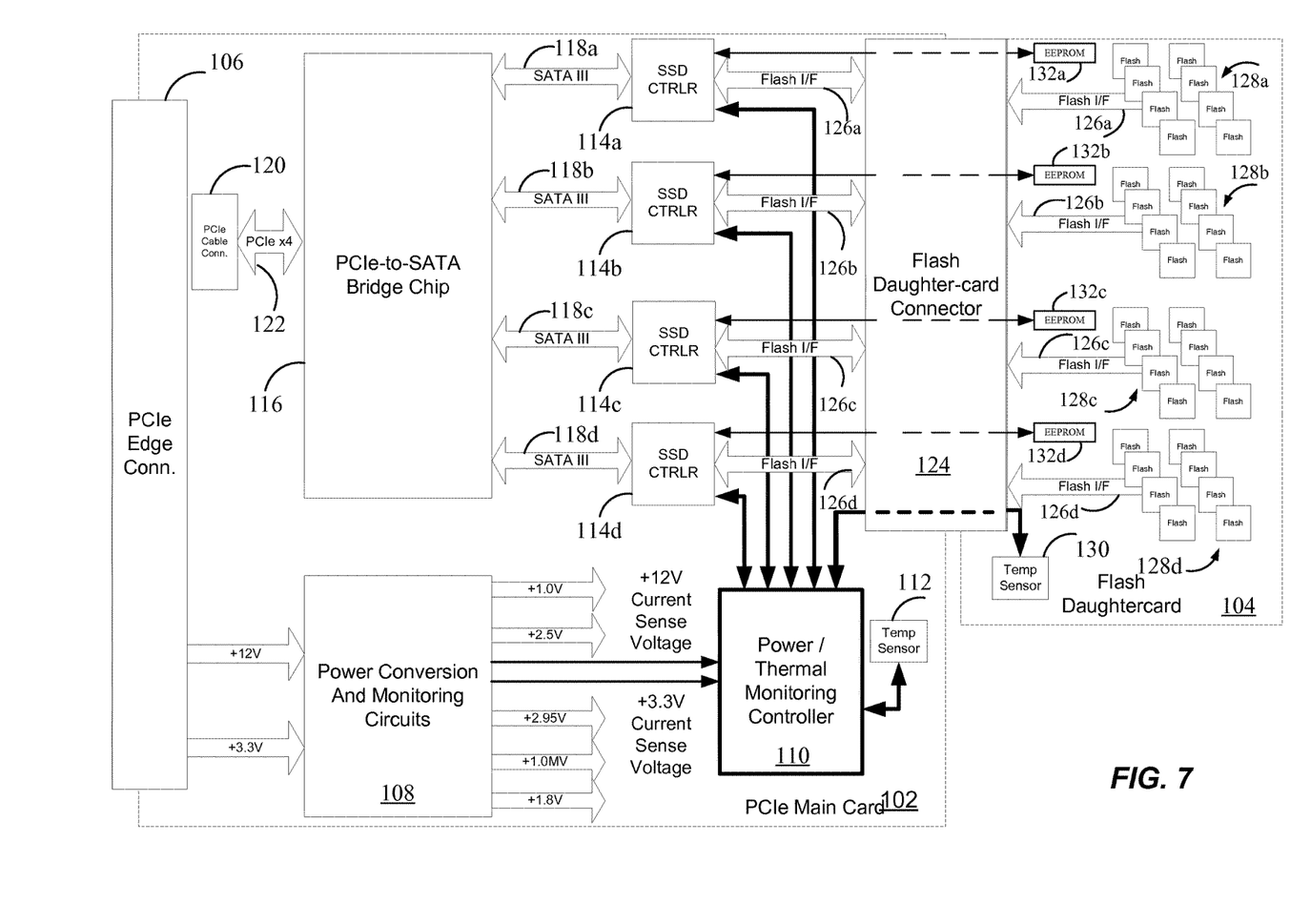
FIG. 7 illustrates a functional block diagram of a subassembly partitioned into a PCIe card and separate flash daughter-card.

To address this issue on future PCIe SSD Accelerator designs, an EEPROM may be included on the flash daughter-card which can be used to record the current wear state of the NAND flash devices. According to one aspect, one EEPROM can be included per SSD controller chip 114a-114d. FIG. 7 illustrates a functional block diagram of the subassembly of FIG. 3 having an EEPROM 132a-132d connected to each SSD controller chip 114a-114d. The SSD controller chips can track wear statistics of the flash devices during runtime and periodically record these statistics in the EEPROMs. An example of the planned contents of the EEPROM is listed in the table below.

| Item | When Updated? | Description |
|---|---|---|
| Serial No. | Initial Production | Unique serial number for the daughtercard assembly. |
| Part No. | Initial Production | Part number for daughtercard assembly |
| MFG Lot Code | Initial Production | Manufacturing lot code (work order id). |
| MFG Date Code | Initial Production | Manufacturing date code. |
| Drive Life Left | Runtime | % of NAND flash device life left. Calculates % of NAND flash rated program/erase cycles consumed to date. Periodically updated by SSD controller during run time. Rate of EEPROM updates can be minimized to perhaps one update per hour of operation. |
| Total Bytes Written to SSD | Runtime | Total bytes of data written to the SSD from the host system. |
| Total Bytes Written To Flash | Runtime | Total bytes of data written to NAND flash. |
| Initial Flash State | Initial Production | Records initial state of factory bad blocks and grown bad blocks during initial factory test. |
| Field Grown Bad Blocks | Runtime | Tracks grown bad blocks that occur during runtime. |
| RFU | Initial Production/ Runtime | Reserved for future use. |

Flash Daughter-card Connector Pinout

According to one aspect, the pinout of the flash daughter-card connector may be optimized for high speed connection to flash memory devices.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A peripheral component interconnect express (PCIe) solid state drive (SSD) accelerator, comprising:
a PCIe card comprising PCIe card components, the PCIe card components comprising:
a microcontroller;
one or more SSD controller chips in communication with the microcontroller;
a first temperature sensor, readable by the microcontroller, for determining if the PCIe card is operating within pre-determined thermal operating margins;
a flash daughter-card connector connected to the one or more SSD controller chips; and
a power conversion and monitor circuit coupled to the microcontroller, the power conversion and monitor circuit including one or more current sensors for monitoring current flowing to the PCIe card; and
a flash daughter-card removably mounted to the PCIe card, the flash daughter-card connected to the PCIe card by the flash daughter-card connector and comprising flash daughter- card components decoupled from the PCIe card components on the PCIe card, the flash daughter-card components comprising:
one or more groups of flash memory devices; and
a second temperature sensor, readable by the microcontroller, for determining if the flash daughter-card is operating within the pre-determined thermal operating margins,
wherein the microcontroller throttles performance of one or more SSD controller chips to reduce power consumption by providing an artificially high temperature reading to the one or more SSD controllers in response to the monitored current flowing to the PCIe card indicating a power consumption approaching a power threshold, causing the one or more SSD controller chips to invoke performance throttling.

2. The accelerator of claim 1, wherein the microcontroller periodically polls the first temperature sensor and the second temperature sensor to measure system temperature to determine if system temperature exceeds a pre-determined temperature threshold.

3. The accelerator of claim 2, wherein the microcontroller operates the one or more SSD controllers at full throttle performance if the system temperature is below the pre-determined temperature threshold.

4. The accelerator of claim 2, wherein the microcontroller operates the one or more SSD controllers at reduced throttle performance if the system temperature exceeds the predetermined temperature threshold.

5. The accelerator of claim 1, wherein the power conversion and monitor circuit provides short term energy during a host power failure.

6. The accelerator of claim 1, wherein the PCIe card further comprises a PCIe to SATA bridge chip for routing data via computer bus interfaces to the one or more SSD controller chips.

7. The accelerator of claim 1, wherein each group in the one or more groups of flash memory devices comprises eight (8) flash devices.

8. The accelerator of claim 1, wherein the flash daughter-card further comprises an electrically erasable programmable read-only memory (EEPROM) connected to each SSD controller chip in the one or more controller chips.

9. The accelerator of claim 8, wherein the one or more SSD controller chips track wear statistics of each flash memory device in the one or more groups of flash memory devices during runtime.

10. The accelerator of claim 9, wherein the wear statistics are periodically stored in the EEPROM for each of the one or more SSD controller chips.

11. The accelerator of claim 1, wherein performance throttling of one or more SSD controller chips includes delaying read/write operation requests from a host system to the one or more groups of flash memory devices.

12. The accelerator of claim 1, wherein if a first temperature, from the first temperature sensor, and a second temperature, from the second temperature sensor, are below a pre-determined temperature threshold, the microcontroller provides the greater of the first temperature and the second temperature to the one or more SSD controller chips.

13. A peripheral component interconnect express (PCIe) solid state drive (SSD) accelerator, comprising:
  a PCIe card comprising PCIe card components, the PCIe card components comprising:
    a microcontroller;
    one or more SSD controller chips in communication with the microcontroller;
    a first temperature sensor, readable by the microcontroller, for determining if the PCIe card is operating within pre-determined thermal operating margins;
    a flash daughter-card connector connected to the one or more SSD controller chips; and
    a power conversion and monitor circuit coupled to the microcontroller, the power conversion and monitor circuit including one or more current sensors for monitoring current flowing to the PCIe card; and
  a flash daughter-card removably mounted to the PCIe card, the flash daughter-card connected to the PCIe card by the flash daughter-card connector and comprising flash daughter-card components decoupled from the PCIe card components on the PCIe card, the flash daughter-card components comprising:
    one or more groups of flash memory devices;
    an electrically erasable programmable read-only memory (EEPROM) connected to each SSD controller chip in the one or more controller chips; and
    a second temperature sensor, readable by the microcontroller, for determining if the flash daughter-card is operating within the pre-determined thermal operating margins; and
  wherein the one or more SSD controller chips track wear statistics of each flash memory device in the one or more groups of flash memory devices during runtime; and
  wherein the wear statistics are periodically stored in the EEPROM for each of the one or more SSD controller chips, and
  the microcontroller throttles performance of one or more SSD controller chips by providing an artificially high temperature reading to the one or more SSD controllers in response to the monitored current flowing to the PCIe card indicating a power consumption approaching a power threshold, causing the one or more SSD controller chips to reduce power consumption.

14. The accelerator of claim 13, wherein the microcontroller periodically polls the first temperature sensor and the second temperature sensor to determine if system temperature exceed a pre-determined temperature threshold.

15. The accelerator of claim 14, wherein the microcontroller operates the one or more SSD controllers at full throttle performance if the system temperature is below the predetermined temperature threshold; and wherein the microcontroller operates the one or more SSD controllers at reduced throttle performance if the system temperature exceeds the predetermined temperature threshold.

16. The accelerator of claim 13, wherein the power conversion and monitor circuit provides short term energy during a host power failure.

17. The accelerator of claim 13, wherein the PCIe card further comprises a PCIe to SATA bridge chip for routing data via computer bus interfaces to the one or more SSD controller chips.

* * * * *